United States Patent
Sato et al.

(10) Patent No.: US 10,529,910 B2
(45) Date of Patent: Jan. 7, 2020

(54) PIEZOELECTRIC DEVICE

(71) Applicant: NIHON DEMPA KOGYO CO., LTD., Tokyo (JP)

(72) Inventors: Yoshiharu Sato, Saitama (JP); Hirokazu Iwata, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 300 days.

(21) Appl. No.: 15/730,749

(22) Filed: Oct. 12, 2017

(65) Prior Publication Data

US 2018/0114893 A1 Apr. 26, 2018

(30) Foreign Application Priority Data

Oct. 26, 2016 (JP) .................. 2016-209336

(51) Int. Cl.
*H01L 41/047* (2006.01)
*H01L 41/053* (2006.01)
*H01L 41/22* (2013.01)
*H01L 41/29* (2013.01)

(52) U.S. Cl.
CPC .......... *H01L 41/047* (2013.01); *H01L 41/053* (2013.01); *H01L 41/22* (2013.01); *H01L 41/29* (2013.01)

(58) Field of Classification Search
CPC ....... H01L 41/047; H01L 41/053; H03H 9/02; H03H 9/02023; H03H 9/02086; H03H 9/02433; H03H 9/19; H03H 9/05; H03H 9/1021; H03H 9/059
USPC .................................................. 331/154–158
See application file for complete search history.

(56) References Cited

U.S. PATENT DOCUMENTS

| | | | | |
|---|---|---|---|---|
| 5,596,239 | A * | 1/1997 | Dydyk ..................... | H03H 3/04 310/311 |
| 5,696,423 | A * | 12/1997 | Dydyk ..................... | H03H 3/04 310/324 |
| 8,558,629 | B2 * | 10/2013 | Asamura ................... | H03L 1/04 331/116 FE |
| 2014/0210567 | A1* | 7/2014 | Koyama .............. | H03H 9/1021 331/158 |
| 2017/0070207 | A1* | 3/2017 | Shimao .................. | H03H 9/132 |
| 2018/0234052 | A1* | 8/2018 | Noto ........................ | H03B 5/32 |
| 2018/0254762 | A1* | 9/2018 | Oi ....................... | H03H 9/02133 |

FOREIGN PATENT DOCUMENTS

JP 2013102315 5/2013

* cited by examiner

*Primary Examiner* — J. San Martin
(74) *Attorney, Agent, or Firm* — JCIPRNET (57) ABSTRACT

A piezoelectric device includes a piezoelectric vibrating piece, an excitation electrode, an extraction electrode, a container, a pad, a conductive member, and a heat conductive metal film. The excitation electrode is disposed on a front surface and a back surface of the piezoelectric vibrating piece. The extraction electrode is extracted from the excitation electrode. The container houses the piezoelectric vibrating piece. The pad is disposed in the container, and the pad is connected to the piezoelectric vibrating piece. The conductive member connects the pad to the extraction electrode. The heat conductive metal film is disposed at least on a surface of a pad side of the piezoelectric vibrating piece, the heat conductive metal film is extracted from the extraction electrode without contacting the excitation electrode.

12 Claims, 13 Drawing Sheets

PIEZOELECTRIC DEVICE

CROSS-REFERENCE TO RELATED APPLICATIONS

This application is based on and claims priority under 35 U.S.C. § 119 to Japanese Patent Application No. 2016-209336, filed on Oct. 26, 2016, the entire content of which is incorporated herein by reference.

TECHNICAL FIELD

This disclosure relates to a piezoelectric device that uses a crystal element.

DESCRIPTION OF THE RELATED ART

In an electronic information communication society, a piezoelectric device such as a crystal unit and a crystal controlled oscillator is indispensable. Such piezoelectric device is required to have various properties including frequency drift characteristics. Here, frequency drift means a phenomenon where, when an electronic component, on which On/Off operations are performed and the electronic component generates heat by the On operation, is mounted at the proximity of the piezoelectric device as another electronic component, the heat generated when the On operation is performed influences the piezoelectric device to causes a short-term drift on an oscillation frequency. The piezoelectric device required a high frequency stability is preferred to have a little drift.

For example, Japanese Unexamined Patent Application Publication No. 2013-102315 discloses a structure where a piezoelectric device includes a container that houses a piezoelectric vibrating piece, and the piezoelectric device includes an electrode pad disposed in the container for installing the piezoelectric vibrating piece and a mounting terminal on an outside of the container so as to be electrically and thermally connected to one another by a conductive portion. Furthermore, Japanese Unexamined Patent Application Publication No. 2013-102315 discloses that the conductive portion is configured to have appropriate diameter and length to adjust a condition of the heat conduction (for example, paragraph 17 and similar paragraph in Japanese Unexamined Patent Application Publication No. 2013-102315).

The method disclosed in Japanese Unexamined Patent Application Publication No. 2013-102315 is certainly a method for adjusting the condition of the heat conduction to the piezoelectric vibrating piece. However, there are some problems, such as cost for designing the container and low freedom of design. The heat conduction efficiency to the piezoelectric vibrating piece itself is considered to be not necessarily satisfactory. More simple and effective means are preferred.

A need thus exists for a piezoelectric device which is not susceptible to the drawback mentioned above.

SUMMARY

According to an aspect of this disclosure, there is provided a piezoelectric device that includes a piezoelectric vibrating piece, an excitation electrode, an extraction electrode, a container, a pad, a conductive member, and a heat conductive metal film. The excitation electrode is disposed on a front surface and a back surface of the piezoelectric vibrating piece. The extraction electrode is extracted from the excitation electrode. The container houses the piezoelectric vibrating piece. The pad is disposed in the container, and the pad is connected to the piezoelectric vibrating piece. The conductive member connects the pad to the extraction electrode. The heat conductive metal film is disposed at least on a surface of a pad side of the piezoelectric vibrating piece, and the heat conductive metal film is extracted from the extraction electrode without contacting the excitation electrode.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

The following describes embodiments of a piezoelectric device according to this disclosure with reference to the drawings. Each drawing used in descriptions is merely illustrated schematically for understanding the embodiments. In each drawing used in descriptions, like reference numerals designate corresponding or identical elements, and therefore such elements will not be further elaborated here. Shapes, dimensions, material, and similar factor described in the following explanations are merely preferable examples within the embodiments. Therefore, the disclosure is not limited to only the following embodiments.

1. Piezoelectric Device of Embodiment

Figure 1A:
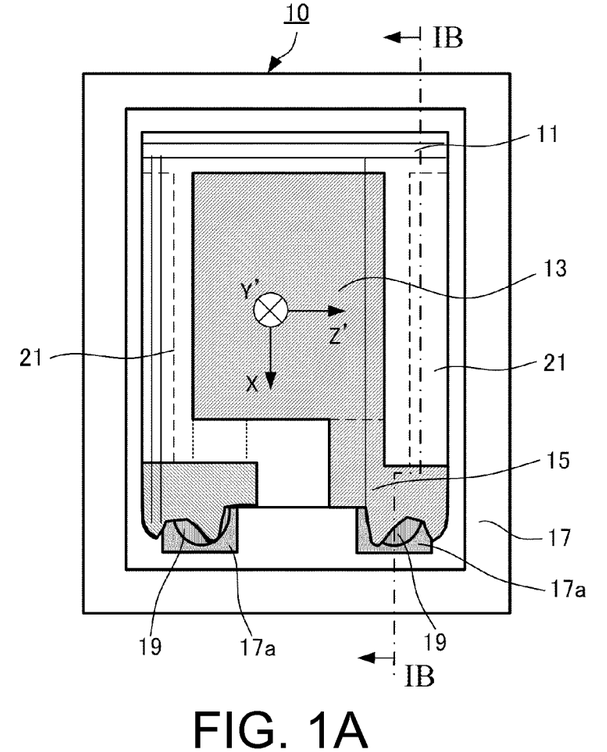
FIG. 1A to FIG. 1C are explanatory drawings of a piezoelectric device of the embodiment.
Figure 1B:
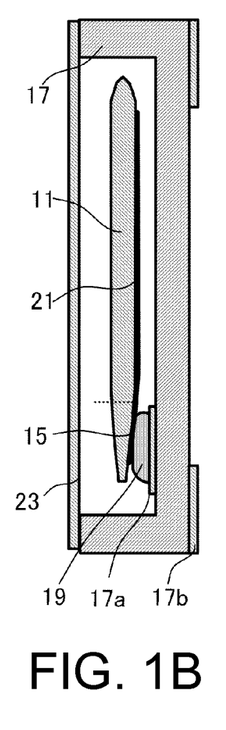
Figure 1C:
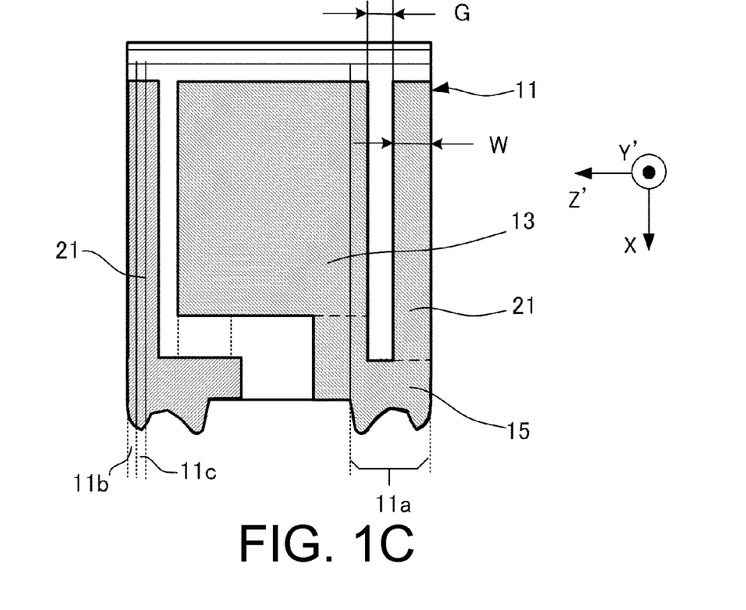

FIG. 1A to FIG. 1C are explanatory drawings of a piezoelectric device 10 of the embodiment. Especially, FIG. 1A is a plan view of the piezoelectric device 10 and is a plan view illustrated by transparently viewing a lid member 23. FIG. 1B is a sectional drawing of the piezoelectric device 10 taken along the line IB-IB in FIG. 1A. FIG. 1C is a plan view illustrating only a crystal element 11, electrodes, and similar part of FIG. 1A viewed from an opposite surface of the crystal element 11 reversed having an X-axis as a rotation center.

Here, coordinate axes X, Y', and Z' illustrated in FIG. 1A and FIG. 1C are crystallographic axes of crystal in an AT-cut crystal element. The AT-cut crystal element is described in, for example, "Handbook of Quartz Crystal Device" (Fourth Edition, page 7 or other pages, published by Quartz Crystal Industry Association of Japan, March 2002) in detail. Therefore, the explanation will be omitted.

The piezoelectric device 10 of the embodiment includes the crystal element 11 as a piezoelectric vibrating piece, excitation electrodes 13, extraction electrodes 15, a container 17, pads 17a, conductive members 19, heat conductive metal films 21, and the lid member 23.

The crystal element 11 has a planar shape, for example, in a rectangular shape, and is an AT-cut crystal element having sides along the X-axis of the crystal as long sides. The excitation electrodes 13 are disposed on front and back of an X-Z' surface as a principal surface of the crystal element 11. The extraction electrodes 15 are extracted from the respective excitation electrodes 13 to a side of one short side of the crystal element 11. The container 17 has depressed portions for housing the crystal element 11, and includes the pads 17a for connecting the crystal element 11 to the one end side of the container 17 as bottom surfaces of the depressed portions and mounting terminals 17b on the bottom surface of the outside of the container 17. The pad 17a is connected to the mounting terminal 17b by an internal wiring (not illustrated) disposed on the container 17. As the container 17, a ceramic package is employable. The conductive member 19 electrically and mechanically connects the above-described pad 17a to the extraction electrode 15, and is typically a conductive adhesive. The crystal element 11 is connected to the pad 17a on a position of the extraction electrode 15 by the conductive member 19.

The heat conductive metal film 21 is disposed at least on a surface of the pad 17a side of the crystal element 11, and the heat conductive metal film 21 is extracted from the extraction electrode 15 and located contactless to the excitation electrode 13. Especially in this embodiment, the heat conductive metal films 21 are disposed only on the surfaces of the pads 17a sides of the crystal element 11, and the heat conductive metal films 21 are disposed along two long sides of the rectangular-shaped crystal element 11, the sides along the X-axis of the crystal in this example, in a state of each having a width W on a region apart from the excitation electrode 13 by a distance G and disposed along the entire excitation electrode 13 in the longitudinal direction.

The excitation electrodes 13, the extraction electrodes 15 and the heat conductive metal films 21 are each constituted of an identical material, for example, a laminated film of a chrome film and a gold film laminated in an order from the crystal element 11 side.

The lid member 23 is bonded on the container 17 to seal the crystal element 11 in the container 17. The structures and the materials of the container 17 and the portion of the lid member 23 for sealing may be arbitrarily employed corresponding to the sealing method.

In the piezoelectric device 10 of this embodiment, while heat is transmitted in the container 17 from the outside of the piezoelectric device 10 via container outer walls and, for example, the mounting terminal 17b, and transmitted to the crystal element 11 via the conductive member 19, the extraction electrode 15, and the excitation electrode 13. The piezoelectric device 10 includes the heat conductive metal film 21 on the region on the edge along the long side of the crystal element 11, thus the heat is transmitted to the crystal element 11 further via the heat conductive metal film 21. Then, the heat conduction to the crystal element 11 is efficiently performed. Accordingly, the frequency drift is improved compared with a configuration of a comparative example. The details will be described below in "3. Experimental Result."

2. Exemplary Crystal Element 2-1. Structure of Crystal Element

Figures 2A, 2B:
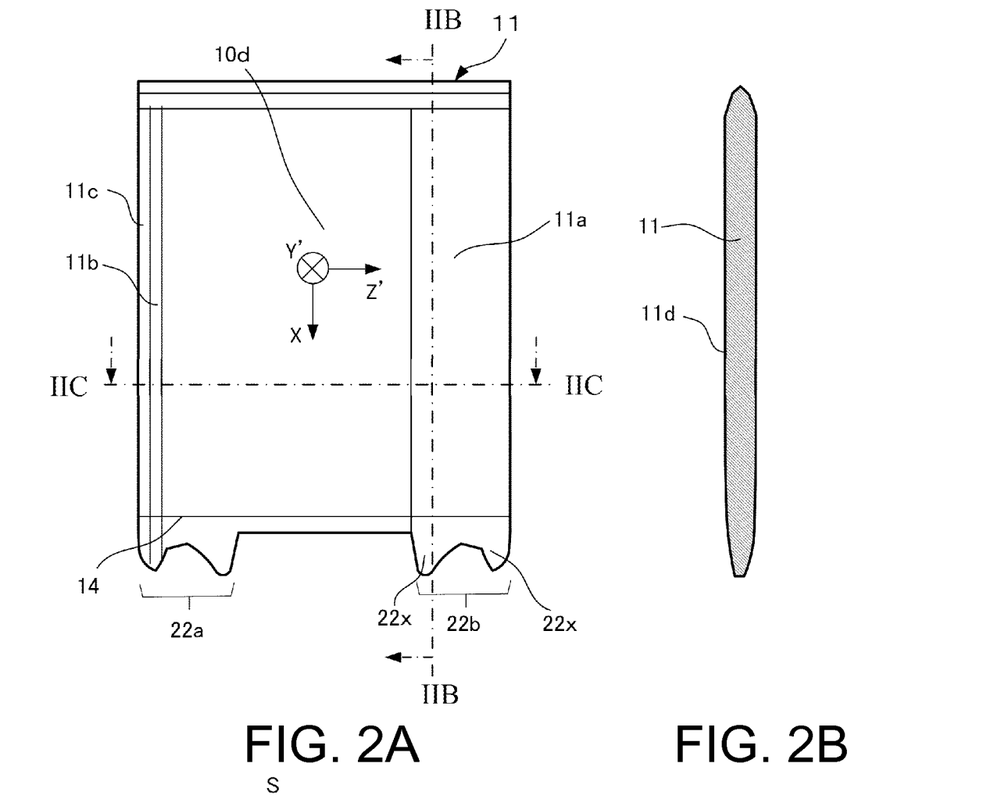
FIG. 2A to FIG. 2D are explanatory drawings of a crystal element preferable to be employed in the embodiment.
Figure 2C:
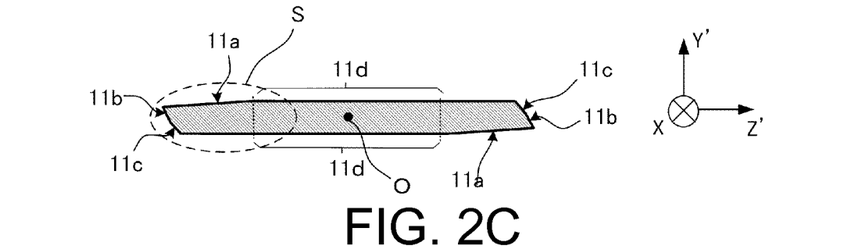
Figure 2D:
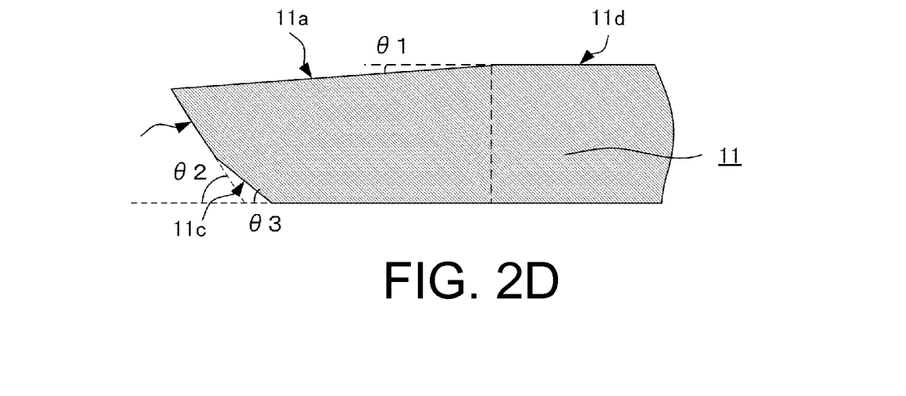

The shape of the crystal element 11 employable in the disclosure is not specifically limited. However, a structure described below with reference to FIG. 2A to FIG. 2D is preferred to be employed. Here, FIG. 2A is a plan view of the preferable crystal element 11, FIG. 2B is a sectional drawing taken along the line IIB-IIB in FIG. 2A, FIG. 2C is a sectional drawing taken along the line IIC-IIC in FIG. 2A, and FIG. 2D is a drawing illustrating an enlarged part S in FIG. 2C.

The crystal element 11 has two side surfaces (Z'-surfaces) intersecting with a Z'-axis of the crystal, and each Z'-surface is configured of three surfaces of a first surface 11a, a second surface 11b, and a third surface 11c. Moreover, the first surface 11a is a surface that intersects with a principal surface 11d of the crystal element 11, and the first surface 11a is a surface corresponding to a surface where the principal surface 11d is rotated around the X-axis of the crystal by θ1.

Furthermore, in the crystal element 11, the first surface 11a, the second surface 11b, and the third surface 11c intersect in this order. Moreover, the second surface 11b is a surface corresponding to a surface where the principal surface 11d is rotated around the X-axis of the crystal by θ2, and the third surface 11c is a surface corresponding to a surface where the principal surface 11d is rotated around the X-axis of the crystal by θ3. These angles θ1, θ2, and θ3 preferably have the values below, while the details will be described later in "3. Experimental Result." θ1=4°±3.5°, θ2=57°±5°, θ3=42°±5°, more preferably, θ1=4°+3°, θ2=57°+3°, θ3=42°±3°

Furthermore, the preferable crystal element 11 is configured such that the two side surfaces (Z'-surfaces) intersecting with the Z'-axis of the crystal are disposed in a point symmetry with a center point O of the crystal element 11 (see FIG. 2C) as a center. Here, the point symmetry includes a state of the point symmetry that can be regarded as a substantially identical shape even if there is a slight difference in the shape.

With respect to the above-described crystal element 11 that has the first to the third surfaces, the excitation electrode 13 and the extraction electrode 15 are disposed as follows. That is, as illustrated in FIG. 1C and FIG. 2C, the excitation electrode 13 is disposed on the principal surface 11d of the crystal element 11, such that a part of the excitation electrode 13 reaches the upper side of the first surface 11a. The extraction electrode 15 is disposed such that at least a part of the extraction electrode 15 is extracted around on the first surface 11a.

When the preferable crystal element 11 is used, the crystal element 11 has a Z'-end surface configured in a beak shape in plan view as illustrated in FIG. 2C, thus this part decreases an unnecessary mode of AT-cut to achieve the piezoelectric device with excellent property in combination with the efficiency of the heat conductive metal film.

The excitation electrode 13 disposed to reach the upper side of the first surface 11a ensures the expansion of the electrode area, and the extraction electrode 15 having a part extracted around on the first surface 11a reduces an influence of leakage of vibration compared with a case where the extraction electrode is extracted around only on the principal surface, thus improving crystal impedance.

2-2. Exemplary Manufacturing Method for Crystal Element 11

The crystal element 11 that has the Z'-end surface including the first to the third surfaces 11a to 11c is manufactured by a method described with reference to FIG. 3A to FIG. 8B. A large number of the crystal element 11 can be manufactured from a quartz-crystal wafer by photolithography technique and wet etching technique. Accordingly, FIG. 3A to FIG. 8B include plan views of a quartz-crystal wafer 11w and enlarged plan views of a part M of the quartz-crystal wafer 11w. Further, some drawings among FIG. 3A to FIG. 6B also include sectional drawings taken along a line IIIB-IIIB, a line IIIC-IIIC a line IVB-IVB, a line IVC-IVC, a line VB-VB, a line VC-VC, and a line VIB-VIB of the part M of the quartz-crystal wafer 11w.

Figure 3A:
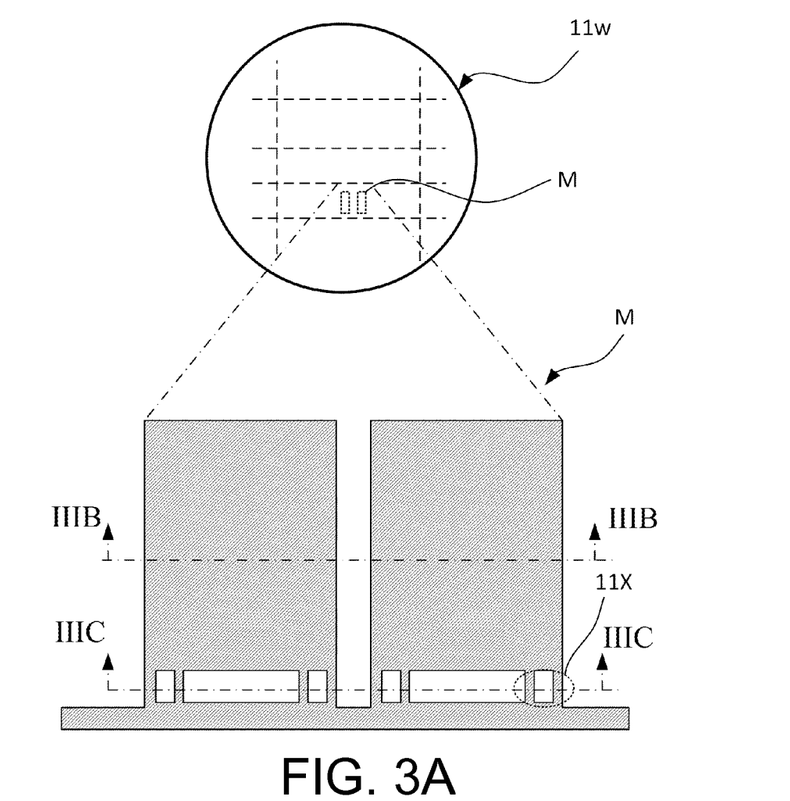
FIG. 3A to FIG. 3C are explanatory drawings of a manufacturing method of the crystal element preferable to be employed in the embodiment.
Figure 3B:
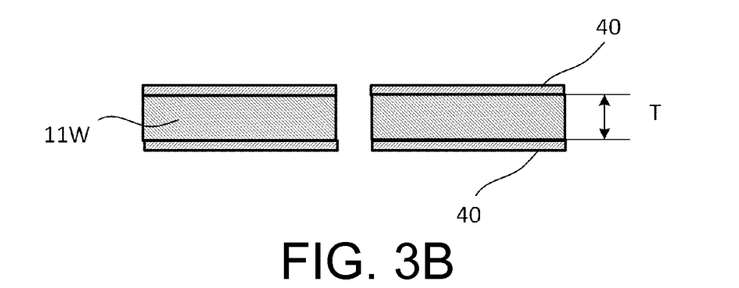
Figure 3C:
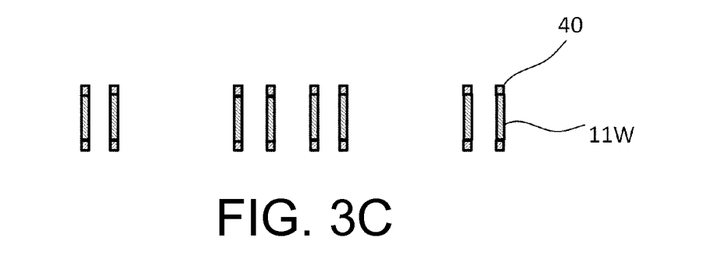

In the exemplary manufacturing method, first, the quartz-crystal wafer 11w is prepared (FIG. 3A to FIG. 3C). While, as it is well known, the oscillation frequency of the AT-cut crystal element 11 is approximately determined by the thickness of the principal surface (X-Z' surface) of the crystal element 11. The quartz-crystal wafer 11w is a wafer with a thickness T (FIG. 3B) that is thicker than a final thickness t (FIG. 5B) of the crystal element 11.

Next, the well-known photolithography technique is used to form etching resist masks 40, which are masks to form the outer shape of the crystal element, on both front and back surfaces of the quartz-crystal wafer 11w (FIG. 3B). The etching resist masks 40 according to the embodiment are configured of a part corresponding to the outer shape of the crystal element, a frame part that holds each crystal element, and a part that connects the crystal element and the frame part (a part indicated as a 11x in FIG. 3A). The etching resist masks 40 are formed to oppose one another on the front and back of the quartz-crystal wafer 11w.

The quartz-crystal wafer 11w after forming of the etching resist masks 40 is dipped in an etching solution mainly composed of hydrogen fluoride for a predetermined period. This process dissolves parts of the quartz-crystal wafer 11w without being covered with the etching resist masks 40 to provide the approximate outer shape of the crystal element 11 (FIG. 3A to FIG. 3C).

Figure 4A:
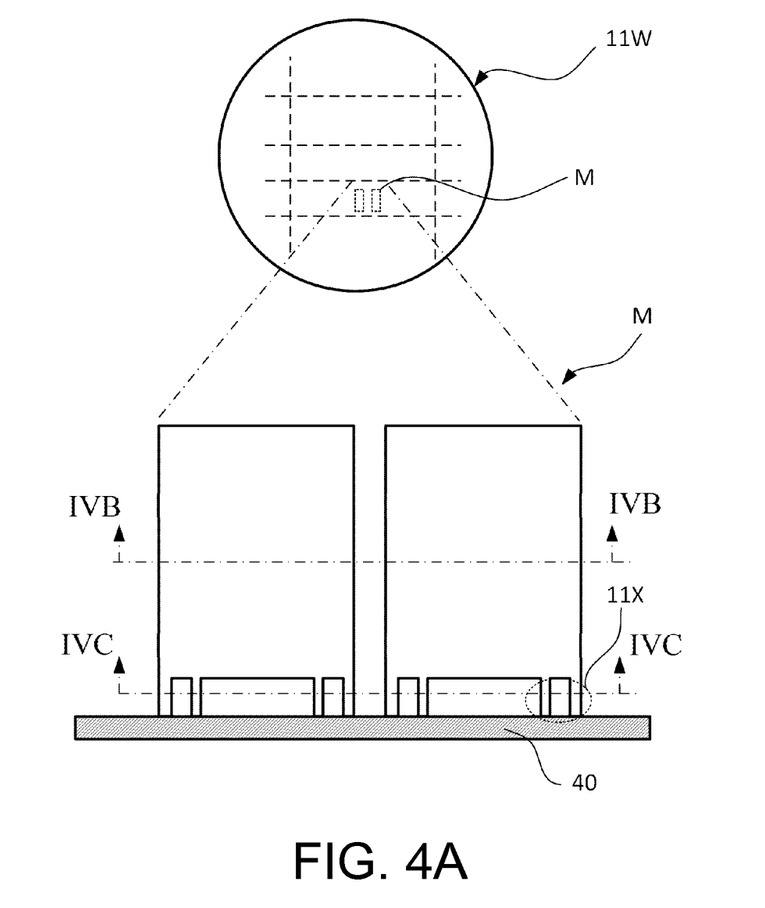
FIG. 4A to FIG. 4C are explanatory drawings of the manufacturing method following FIG. 3A to FIG. 3C.
Figure 4B:
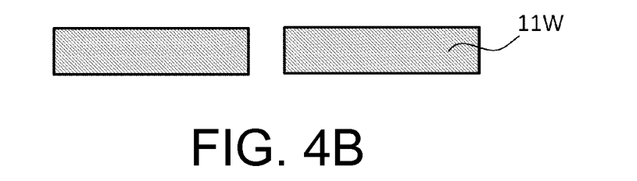
Figure 4C:
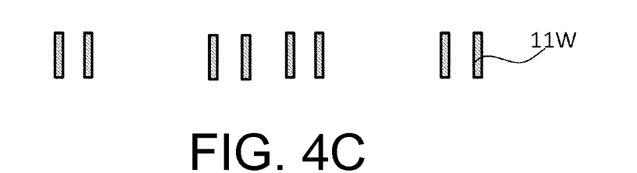
Figure 5A:
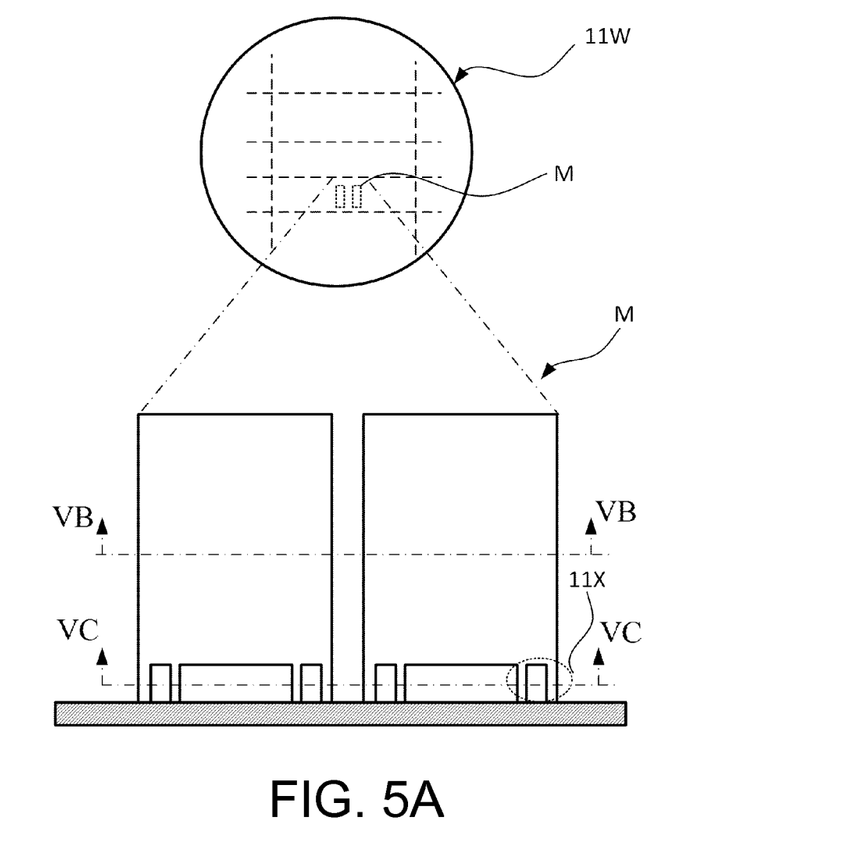
FIG. 5A to FIG. 5C are explanatory drawings of the manufacturing method following FIG. 4A to FIG. 4C.
Figure 5B:
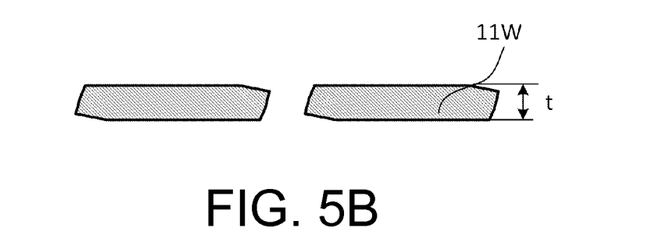
Figure 5C:
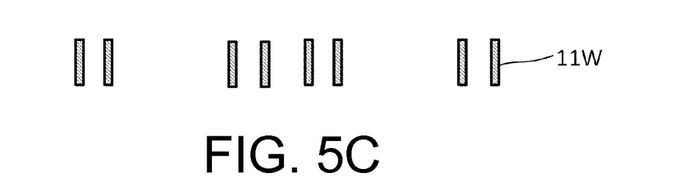

Next, the etching resist masks 40 are removed from the quartz-crystal wafer 11w. In this process, the exemplary manufacturing method removes only the part corresponding to the crystal element 11 of the etching resist masks 40, and leaves the part corresponding to a frame portion and a connecting portion (FIG. 4A to FIG. 4C). This is performed to maintain the strength of the frame portion and the connecting portion. It is needless to say that the etching resist mask covering the entire or a part of the frame portion and the connecting portion may be removed depending on the design.

Figure 7A:
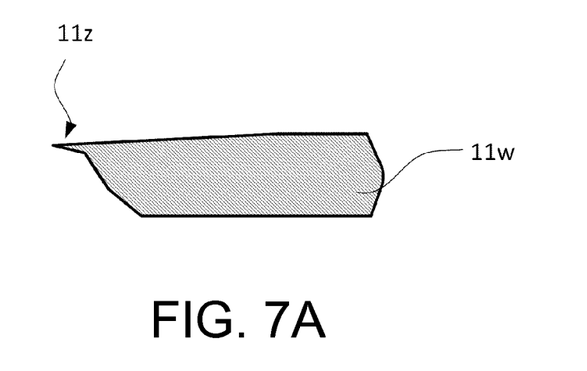
FIG. 7A to FIG. 7C are explanatory drawings of an experimental result of the crystal element preferable to be employed in the embodiment.
Figure 7B:
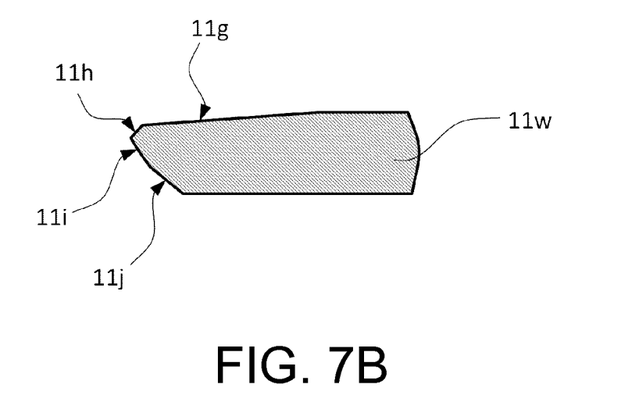
Figure 7C:
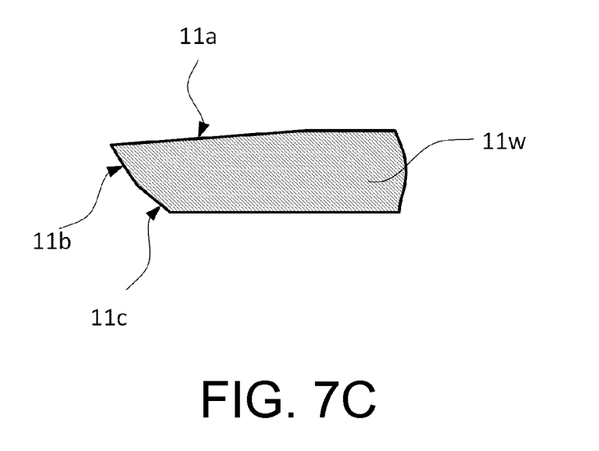

Next, the quartz-crystal wafer 11w is dipped again in the etching solution mainly composed of hydrogen fluoride for the predetermined period. Here, the predetermined period is a period where the thickness t (FIG. 5B) of a forming scheduled region for the crystal element 11 can satisfy the specification of an oscillation frequency required to the crystal element 11, and the Z'-side surface of the crystal element 11 can be constituted of the first surface 11a to the third surface 11c according to the embodiment. These periods can be determined by experiments in advance. The experiments performed by the inventor have found that, as the etching proceeds, as illustrated in FIG. 7A, the Z'-surface of the crystal element 11 varies in a state where a protrusion 11z are left, a state where the Z'-surface is constituted of four surfaces of the first to a fourth surface 11g, 11h, 11i, and 11j (the fourth surface generating state) as illustrated in FIG. 7B, and a state where the Z'-surface is constituted of three surfaces of the first to the third surface 11a, 11b, and 11c according to the embodiment (the state of the embodiment) in this order. Moreover, the experiments have found that, to obtain the side surface constituted of the three surfaces of the first to the third surface according to the embodiment, in the case where the etching is performed in the predetermined etchant, the etching temperature, and similar condition, it is necessary for the quartz-crystal wafer 11w to be performed the etching until the quartz-crystal wafer 11w has the thickness with a range of 55% to 25% with respect to an initial thickness T. Therefore, the initial thickness T, the above-described etching period, and similar factor are determined such that the specification of the oscillation frequency and the three surfaces of the first to the third surface are obtained.

Next, the etching resist masks 40 are removed of the quartz-crystal wafer 11w after the above-described etching to expose a crystal surface. Then, a well-known film formation method is used to form a metal film (not illustrated) for forming excitation electrodes 13, extraction electrodes 15, and heat conductive metal films 21 of the crystal resonator on the entire surface of the quartz-crystal wafer 11w. Next, the well-known photolithography technique and metal etching technique are used to perform a patterning on the metal film in shapes of the excitation electrodes 13, the extraction electrodes 15, and the heat conductive metal films 21. This provides the wafer that has a large number of crystal elements including the excitation electrode 13, the extraction electrode 15, and the heat conductive metal film 21 (FIG. 6A and FIG. 6B).

Figure 6A:
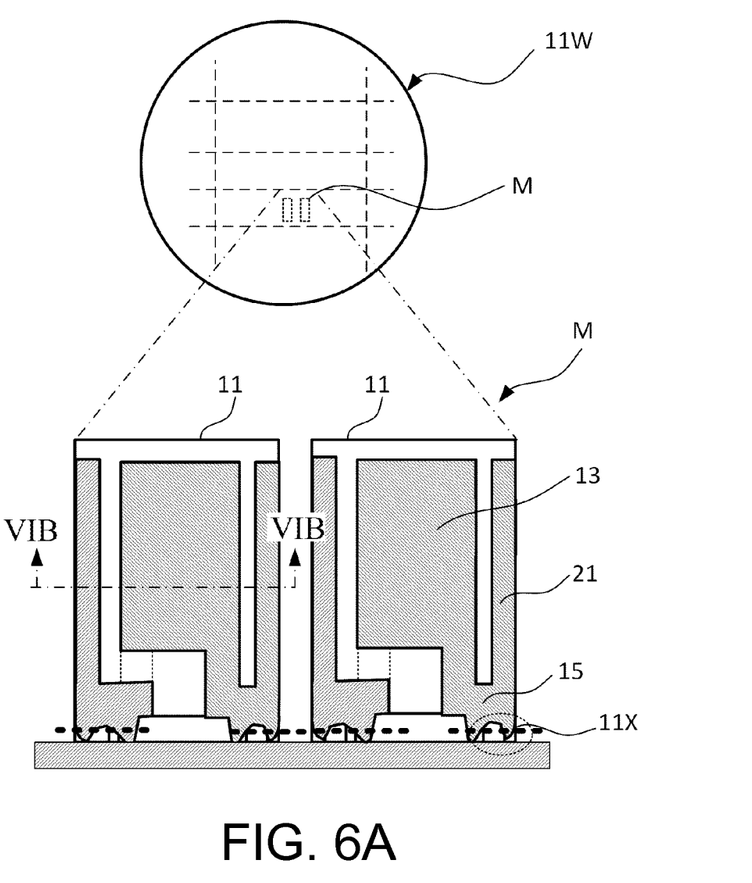
FIG. 6A and FIG. 6B are explanatory drawings of the manufacturing method following FIG. 5A to FIG. 5C.
Figure 6B:
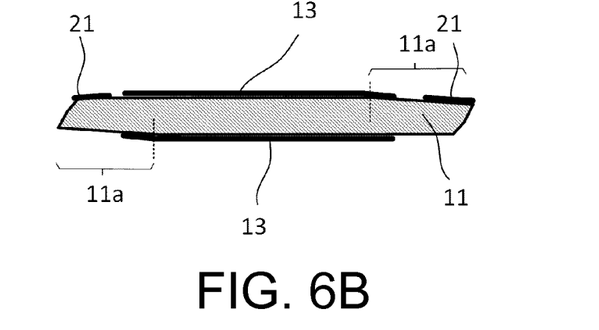

In a state illustrated in FIG. 6A and FIG. 6B, the crystal resonator is connected to the quartz-crystal wafer 11w via a connecting portion 11x. Therefore, at first, an appropriate external force is applied to the connecting portion 11x to separate the crystal element 11 from the quartz-crystal wafer 11w and individually dice the crystal element 11. On the other hand, as the container 17, for example, a well-known ceramic package that has a depressed portion for housing the crystal element 11 is prepared.

The crystal element 11 is mounted in the depressed portion of the container 17. In detail, as illustrated in FIG. 1A, a conductive adhesive material as the conductive member 19 is applied over a pad 17a to fix the crystal element 11 on the pad 17a at the position of the extraction electrode 15. Then, a well-known method is used to adjust the oscillation frequency of the crystal element 11 to a predetermined value. Next, after the inside of the container 17 is made in an appropriate vacuum atmosphere, an inert gas atmosphere, or similar atmosphere, the atmosphere is sealed by the lid member 23. Thus the piezoelectric device 10 of the embodiment is obtained.

3. Experimental Result 3-1. Crystal Element 11

Figure 8A:
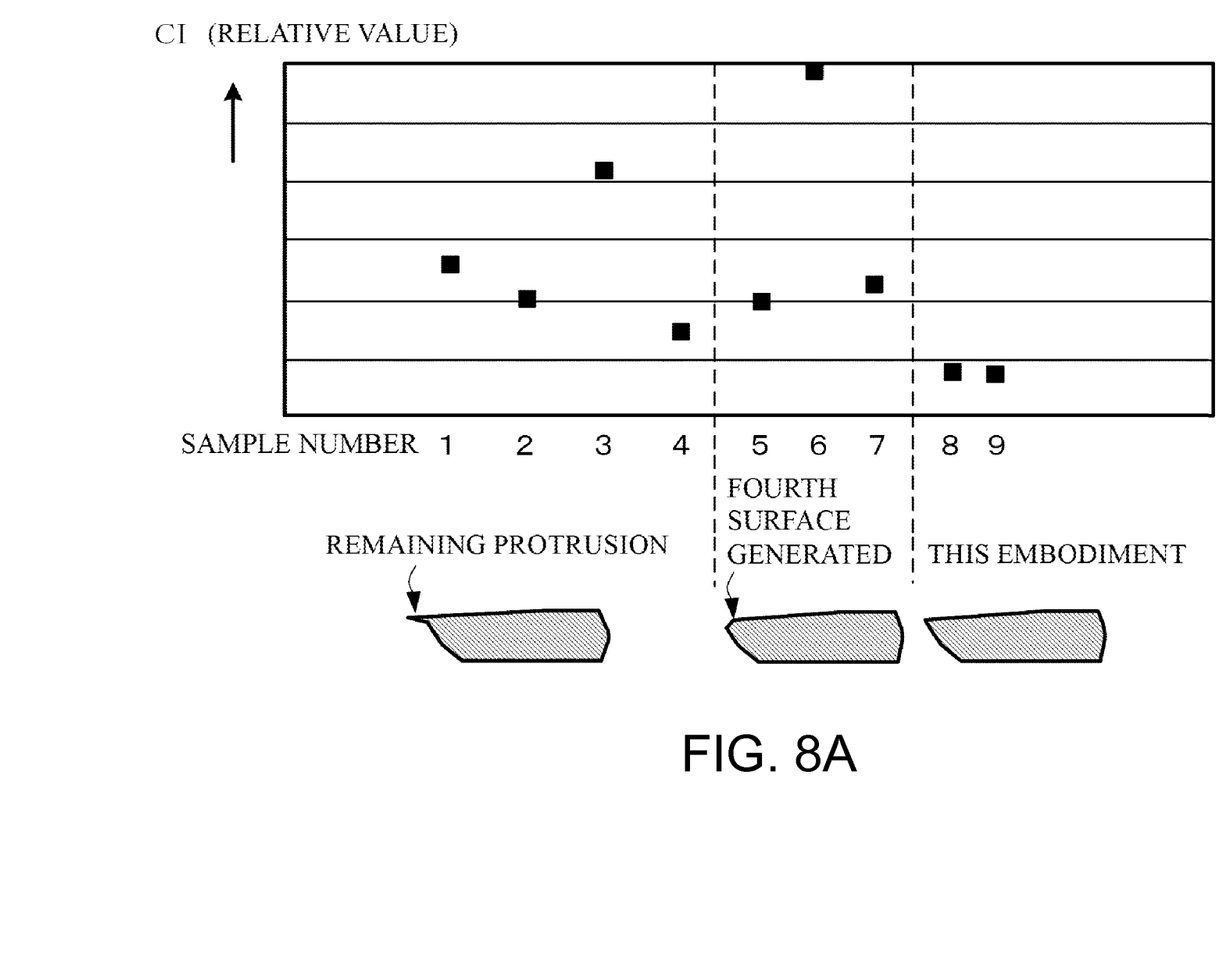
FIG. 8A and FIG. 8B are explanatory drawings of the experimental result, following FIG. 7A to FIG. 7C, of the crystal element preferable to be employed in the embodiment.

Next, experimental results relating to a reason for generating the first to the third surfaces of the crystal element 11 will be described with reference to FIG. 7A to FIG. 8B. FIG. 8A is an explanatory drawing illustrating how impedances of the piezoelectric device 10 configured of the crystal element are different depending on the difference of the shape of the Z'-surface of the crystal element. FIG. 8A indicates sample numbers of the crystal elements used in the experiment and features of the shape of the Z'-surface of each sample on the horizontal axis, and indicates the impedance (relative value) on the vertical axis.

As illustrated in FIG. 8A, in a state of the preferable example of the embodiment where the Z'-surface of the crystal element is configured of the first to the third surfaces, the impedance is improved compared with a sample that has a protrusion remaining on the Z'-surface of the crystal element and a sample in which the Z'-surface of the crystal element is configured of four surfaces.

Figure 8B:
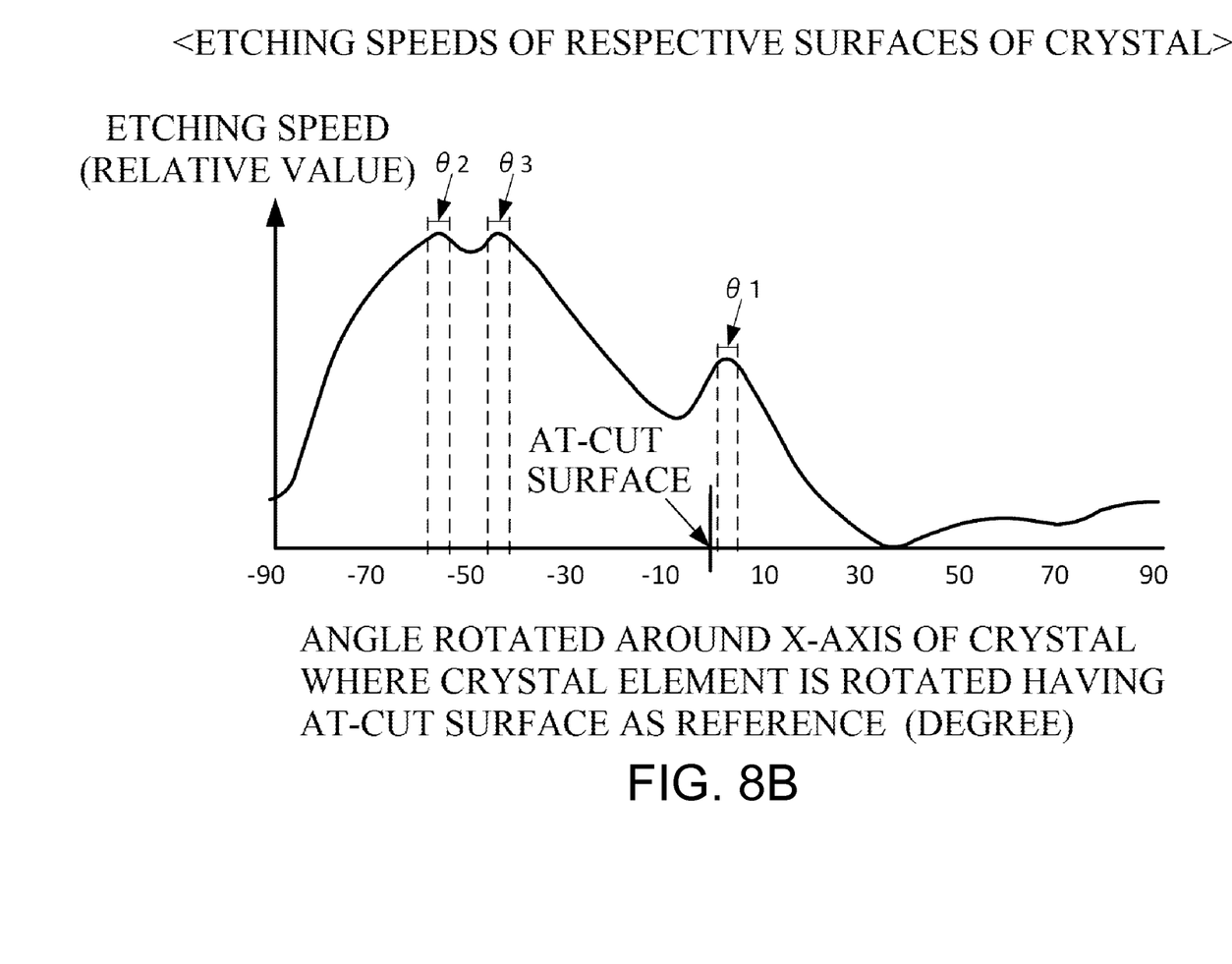

FIG. 8B is an explanatory drawing illustrating the first to the third surface 11a, 11b, and 11c of the preferable crystal element. Specifically, FIG. 8B indicates the experimental result by the inventors according to this application, and indicates the difference of the etching speed of various crystal surfaces of the crystal to a hydrogen fluoride-based etchant. More specifically, FIG. 8B indicates the angles where the AT-cut principal surface as a reference is rotated around the X-axis of the crystal on the horizontal axis, and indicates the etching speed of each crystal surface that is obtained by rotating an AT-cut plate as described above on the vertical axis. The etching speed of each surface is indicated by the relative value as a reference etching speed of the AT-cut surface.

As illustrated in FIG. 8B, the crystal has the maximum etching speed on each surface of a surface corresponding to a surface where the AT-cut principal surface is rotated by $\theta 1$, a surface corresponding to a surface where the AT-cut principal surface is rotated by $\theta 2$, and a surface corresponding to a surface where the AT-cut principal surface is rotated by $\theta 3$. Then, $\theta 1$ is approximately 4°, $\theta 2$ is approximately −57°, and $\theta 3$ is approximately −42°. Furthermore, the experiment by the inventor found that, in the region where the impedance is proper, as described with reference to FIG. 9A and FIG. 9B, the angles are as follows: $\theta 1=4°±3.5°$, $\theta 2=57°±5°$, and $\theta 3=42°±5°$, and more preferably, $\theta 1=4°±3°$, $\theta 2=57°±3°$, and $\theta 3=42°±3°$. Each surface specified by these $\theta 1$ to $\theta 3$ corresponds to the first to the third surfaces according to the embodiment.

3-2. Frequency Drift

A description will be given of comparison results of the frequency drift among two kinds of piezoelectric devices (hereinafter referred to as piezoelectric devices of a working example 1 and a working example 2) as the piezoelectric devices of the embodiment where the locations and the shapes of the excitation electrode 13, the extraction electrode 15, and the heat conductive metal film 21 are differed, and two kinds of piezoelectric devices (hereinafter referred to as piezoelectric devices of a comparative example 1 and a comparative example 2) where the locations and the shapes of the excitation electrode 13 and the extraction electrode 15 are differed without disposing the heat conductive metal film 21.

The piezoelectric device of the working example 1 is a piezoelectric device described with reference to FIG. 1A to FIG. 1C, and the used crystal element 11 has an X-dimension=x, a Z'-dimension=z, a Z'-dimension of the first surface 11a≈0.3z, an X-dimension of the excitation electrode 13≈0.63x, a Z'-dimension of the excitation electrode 13≈0.62z. Then, the heat conductive metal film 21 has a dimension W≈0.11z in the Z'-direction.

Figure 9A:
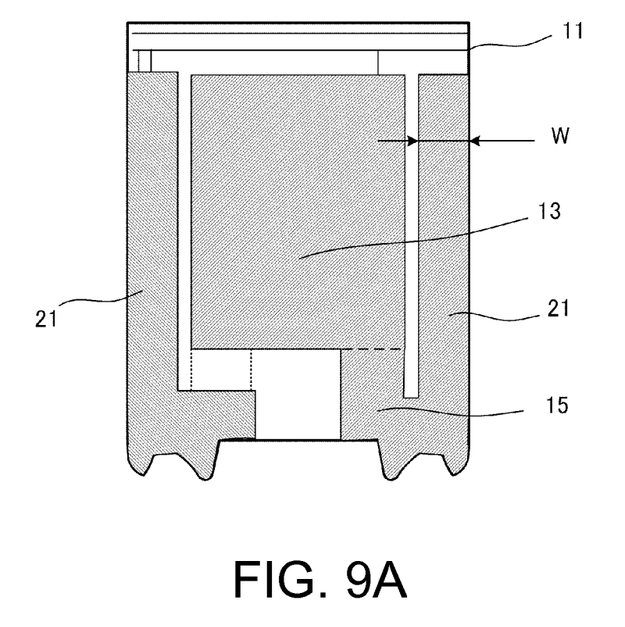
FIG. 9A and FIG. 9B are explanatory drawings of a working example and the other embodiment.

The piezoelectric device of the working example 2 employs the crystal element illustrated in FIG. 9A as the crystal element 11. That is, comparing with the working example 1, the piezoelectric device of the working example 2 includes the crystal element, the excitation electrode, and the extraction electrode similar to the working example 1 except that the Z'-dimension W of the heat conductive metal film 21≈0.16z. The heat conductive metal film 21 is also referred to as heat conductive thin film.

Figure 10A:
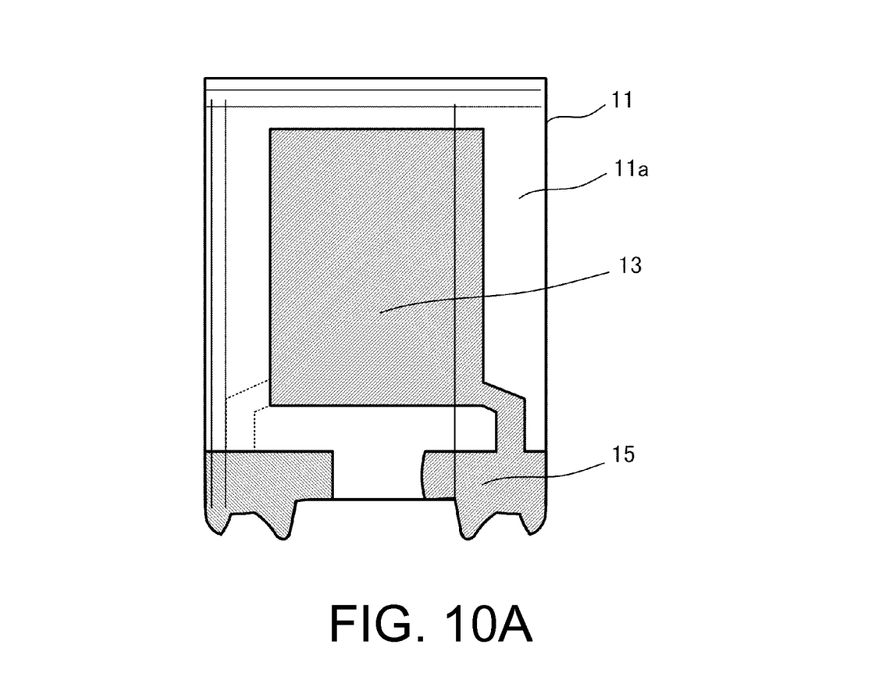
FIG. 10A and FIG. 10B are explanatory drawings of a comparative example.

On the other hand, the piezoelectric device of the comparative example 1 employs the crystal element illustrated in FIG. 10A as the crystal element 11. That is, comparing with the working example 1, the piezoelectric device of the comparative example 1 includes the crystal element, the excitation electrode, and the extraction electrode similar to the working example 1 except that the extraction electrode 15 is extracted around on the first surface 11a without disposing the heat conductive metal film.

Figure 10B:
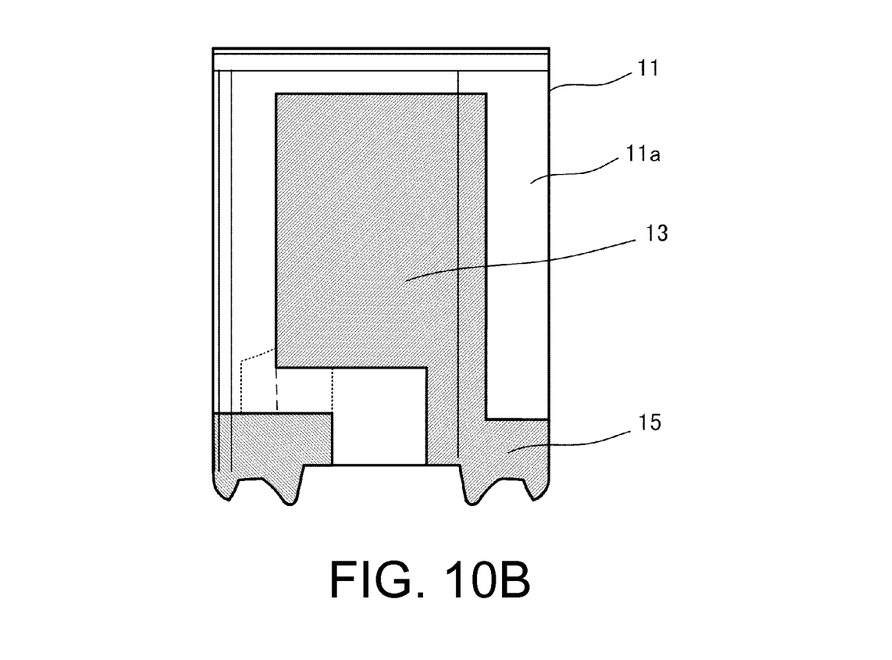

The piezoelectric device of the comparative example 2 employs the crystal element illustrated in FIG. 10B as the crystal element 11. That is, comparing with the working example 1, the piezoelectric device of the comparative example 2 includes the crystal element, the excitation electrode, and the extraction electrode similar to the working example 1 except that the extraction electrode 15 is extracted around across the principal surface and the first surface 11a of the crystal element without disposing the heat conductive metal film.

In the respective piezoelectric devices of the working examples and the comparative examples, the crystal elements 11 have vibration frequencies identical to one another.

Figure 11A:
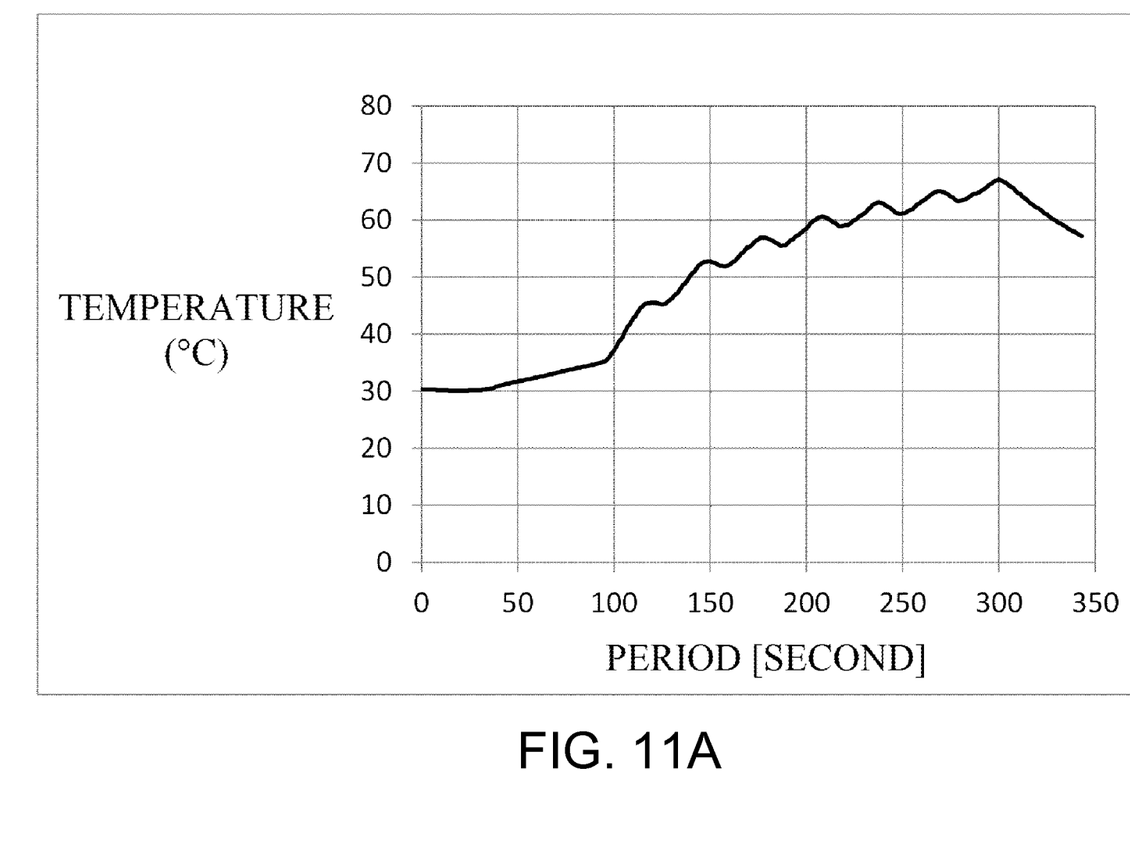
FIG. 11A and FIG. 11B are explanatory drawings of frequency drift.
Figure 11B:
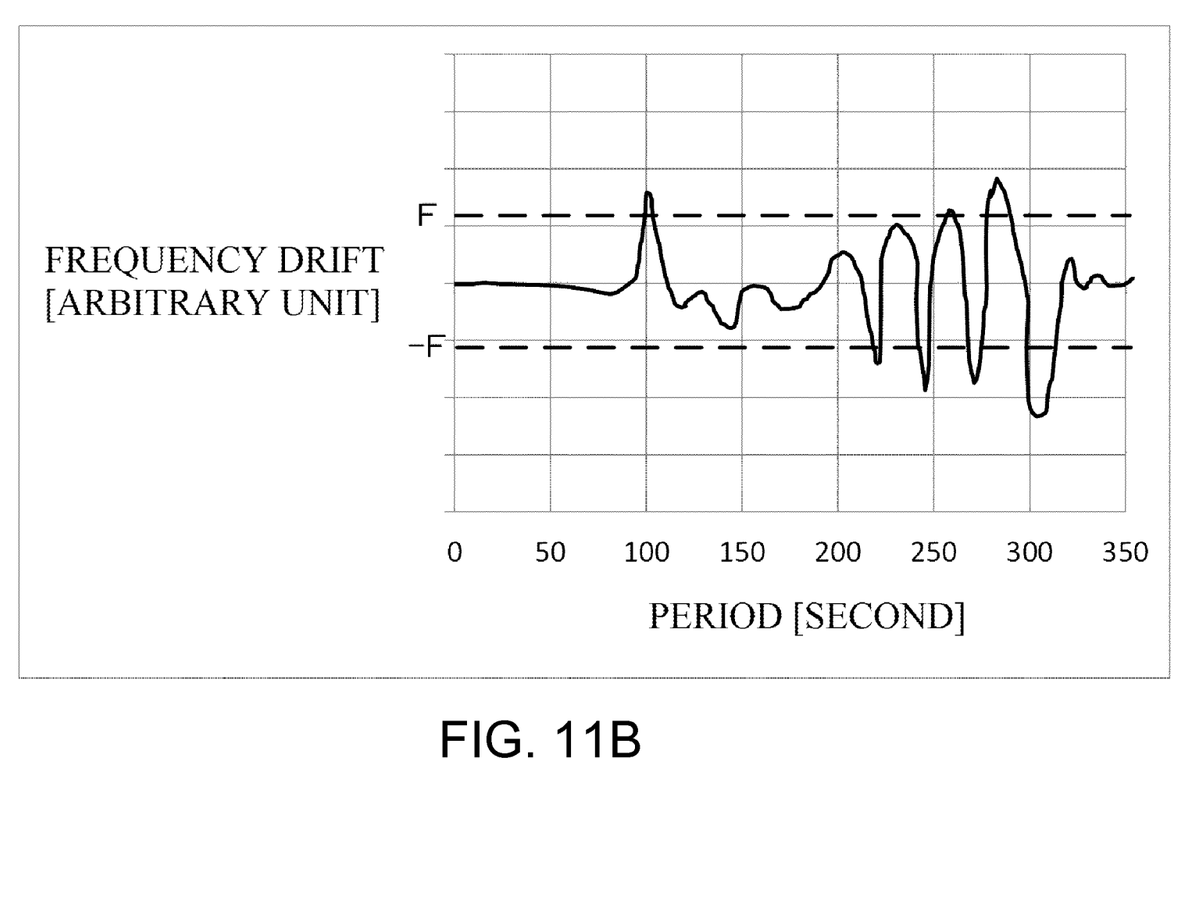

An examination was performed on the variation of the frequency of the piezoelectric device in the case where heaters are contacted with the respective piezoelectric devices of the working examples and the comparative examples to apply heat. FIG. 11A and FIG. 11B are explanatory drawings of the examination. Especially, FIG. 11A indicates a profile of the heat applied on the piezoelectric device with periods on the horizontal axis and temperatures on the vertical axis. FIG. 11B indicates a variation of the frequency of the piezoelectric device to the application of the heat of the profile in FIG. 11A with periods on the horizontal axis and variation rate (arbitrary unit) of the frequency on the vertical axis. Two dashed lines in FIG. 11B indicate a specification of the frequency drift, and in this case, the frequency variation in a range of values of ±F means to satisfy the specification. A curved line drawn by a solid line in FIG. 11B indicates an image of the frequency drift.

In such heat application experiment, the respective piezoelectric devices of the working example 1 and the working example 2 satisfied the specification of the frequency drift of ±F. In contrast, the respective piezoelectric devices of the comparative example 1 and the comparative example 2 did not satisfy the specification of the frequency drift of ±F. For the crystal impedance in the respective piezoelectric devices, the difference between the working examples and the comparative examples was not recognized.

The experimental result indicates that the heat conductive metal film 21 contributes to the improvement of the frequency drift without decreasing the property of the piezoelectric device such as the crystal impedance.

4. Other Embodiments

While the embodiment of the piezoelectric device of this disclosure is described above, this disclosure is not limited to the above-described embodiment. For example, while a crystal unit is described as an exemplary piezoelectric device in the above description, this disclosure is applicable to a crystal controlled oscillator where an IC chip for an oscillator circuit and temperature compensation are housed with the crystal element 11 in the container 17. This disclosure is also applicable to a crystal controlled oscillator of what is called an H-shaped structure where the container 17 has an outer bottom surface as a depressed portion for storing the IC chip for the oscillator circuit and the temperature compensation and the IC chip is housed in the depressed portion of the outer bottom surface.

Figure 9B:
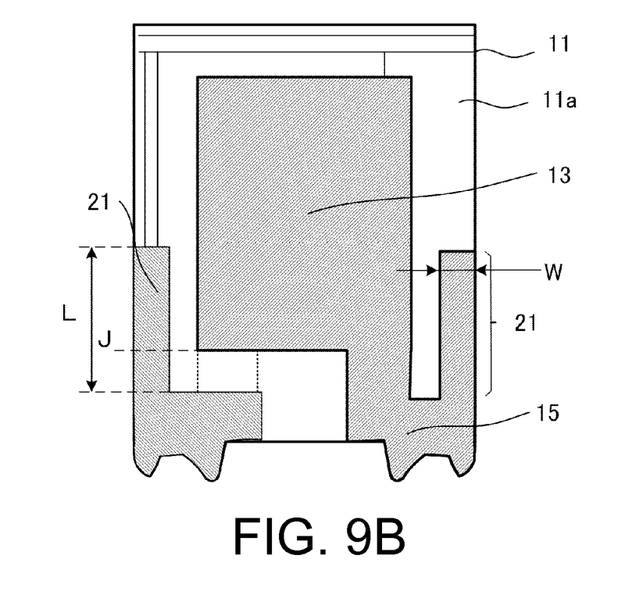

The shape and the location of the heat conductive metal film 21 may be variously changed within the spirit and scope of the disclosure. For example, as illustrated in FIG. 9B, when the heat conductive metal films are disposed along facing two sides of the crystal element, a width W and a length L may be changed corresponding to the design. However, the length L is preferred to be a length extending over a lower end position J of the excitation electrode from a viewpoint of the heat conduction efficiency. While an example of the crystal element that has a planar shape in a rectangular shape is described above, this disclosure is applicable to the crystal element that has a planar shape in other shape.

While the above description employs an example where this disclosure is applied to an AT-cut crystal element having the long sides in the X-axis direction of the crystal, this disclosure is applicable to an AT-cut crystal element having the long sides in the Z'-axis direction of the crystal. While the above description employs an example of a cantilever structure where the crystal element is supported on one side, this disclosure is applicable to a piezoelectric device of a doubly supported structure where the crystal element is supported on the facing two sides. While the above description employs an example where an AT-cut crystal element is used as the crystal element, this disclosure is applicable to a crystal element having a twice-rotated cut for, example, an SC-cut. This disclosure is also applicable to a piezoelectric device that uses a piezoelectric material other than the crystal, for example, lithium tantalate and piezoelectric ceramic. While the above description employs an example where the heat conductive metal films are disposed only on the surface of the pad side of the crystal element, the heat conductive metal films may be disposed on both surfaces of the crystal element. However, considering to reduce the influence of motional capacitance of the crystal element, the possibility of short circuit of the excitation electrode and the heat conductive metal film, and similar possibility, the heat conductive metal films are preferred to be disposed on only one surface. While the above description employs a structure where the container has a depressed portion to house the crystal element, this disclosure is applicable to a piezoelectric device with a structure where a pad is disposed on a flat plate base, the crystal element is mounted on the base, and the crystal element is covered with a cap that has a depressed portion.

With the piezoelectric device according to the embodiments, the predetermined heat conductive metal film causes the heat outside the piezoelectric device to be transmitted in the container via the outer wall of the container and the mounting terminal disposed, for example, on the outer bottom surface of the container, and the heat is transmitted to the piezoelectric vibrating piece via the pad inside the container, the conductive member, the extraction electrode, and the excitation electrode, while the heat is transmitted to the piezoelectric vibrating piece also via the heat conductive metal film extracted from the extraction electrode. This causes the external heat to be easily transmitted to the piezoelectric vibrating piece by the heat conductive metal film compared with a case where the heat conductive metal film is not disposed. Accordingly, the piezoelectric device having excellent thermal responsiveness is provided to ensure the frequency drift reduction.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device, comprising:
   a piezoelectric vibrating piece;
   an excitation electrode, disposed on a front surface and a back surface of the piezoelectric vibrating piece;
   an extraction electrode, extracted from the excitation electrode;
   a container that houses the piezoelectric vibrating piece;
   a pad, disposed in the container, and the pad being connected to the piezoelectric vibrating piece;
   a conductive member that connects the pad to the extraction electrode; and
   a heat conductive metal film, disposed at least on a surface of a pad side of the piezoelectric vibrating piece, and the heat conductive metal film being extracted from the extraction electrode without contacting the excitation electrode.

2. The piezoelectric device according to claim 1, wherein the heat conductive metal film is disposed only on the surface of the pad side of the piezoelectric vibrating piece.

3. The piezoelectric device according to claim 1, wherein the piezoelectric vibrating piece is an AT-cut crystal element in a rectangular shape having a side along an X-axis direction of crystal as a long side, and
   the heat conductive metal film is disposed on a part of or entire of a region along each of the long side of the crystal element.

4. The piezoelectric device according to claim 1, wherein the piezoelectric vibrating piece is an AT-cut crystal element where both side surfaces intersecting with a Z'-axis as a crystallographic axis of a crystal are each configured of three surfaces of a first surface, a second surface and a third surface.

5. The piezoelectric device according to claim 4, wherein the first surface is a surface corresponding to a surface where a principal surface is rotated around an X-axis of crystal by 4°±3.5°,
   the principal surface is an X-Z' surface indicated by crystallographic axes of the crystal of the AT-cut crystal element.

6. The AT-cut crystal element according to claim 4, wherein
   the first surface, the second surface, and the third surface intersect in this order, and
   the first surface is a surface corresponding to a surface where the principal surface is rotated around an X-axis of crystal by 4°±3.5°,
   the second surface is a surface corresponding to a surface where the principal surface is rotated around the X-axis of the crystal by −57°±5°, and the third surface is a surface corresponding to a surface where the principal surface is rotated around the X-axis of the crystal by −42°±5°.

7. The piezoelectric device according to claim 4, wherein the first surface, the second surface, and the third surface intersect in this order, and the first surface is a surface corresponding to a surface where the principal surface is rotated around an X-axis of crystal by 4°±3°, the second surface is a surface corresponding to a surface where the principal surface is rotated around the X-axis of the crystal by −57°±3°, and the third surface is a surface corresponding to a surface where the principal surface is rotated around the X-axis of the crystal by −42°±3°.

8. The piezoelectric device according to claim 4, wherein the AT-cut crystal element has a rectangular shape in plan view, and the heat conductive metal film is disposed along each of two sides parallel to an X-axis of crystal of the AT-cut crystal element in the rectangular shape and is disposed in a part of or entire of a direction of the two sides.

9. The piezoelectric device according to claim 4, wherein the extraction electrode has at least a part extracted around on the first surface.

10. The piezoelectric device according to claim 4, wherein the excitation electrode has a part disposed to extend over the first surface.

11. The piezoelectric device according to claim 1, wherein the piezoelectric device is a crystal unit.

12. The piezoelectric device according to claim 1, wherein the piezoelectric device is a crystal controlled oscillator configured to have a temperature compensation function.

* * * * *